(12) United States Patent
Ohsawa et al.

(10) Patent No.: US 10,725,601 B2
(45) Date of Patent: Jul. 28, 2020

(54) TOUCH SENSOR

(71) Applicant: POLYMATECH JAPAN CO., LTD., Saitama, Saitama (JP)

(72) Inventors: Yuta Ohsawa, Saitama (JP); Yoshifumi Honmatsu, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 15/127,496

(22) PCT Filed: Mar. 30, 2015

(86) PCT No.: PCT/JP2015/059992
§ 371 (c)(1),
(2) Date: Sep. 20, 2016

(87) PCT Pub. No.: WO2015/147323
PCT Pub. Date: Oct. 1, 2015

(65) Prior Publication Data
US 2017/0139511 A1   May 18, 2017

(30) Foreign Application Priority Data
Mar. 28, 2014   (JP) .................................. 2014-068869

(51) Int. Cl.
*G06F 3/045* (2006.01)
*G06F 3/044* (2006.01)
*H03K 17/96* (2006.01)

(52) U.S. Cl.
CPC .............. *G06F 3/045* (2013.01); *G06F 3/044* (2013.01); *H03K 17/9622* (2013.01);
(Continued)

(58) Field of Classification Search
None
See application file for complete search history.

(56) References Cited

U.S. PATENT DOCUMENTS

| 2005/0070599 A1 | 3/2005 | Ewing et al. |
| 2007/0139393 A1 | 6/2007 | Nakanishi et al. |

(Continued)

FOREIGN PATENT DOCUMENTS

| JP | 2007-172025 A | 7/2007 |
| JP | 2013-030166 A | 2/2013 |

(Continued)

OTHER PUBLICATIONS

Kenta_machine translation_JP2013109520A-pub.date_06-06-2013.pdf.*

(Continued)

*Primary Examiner* — Jinsong Hu
*Assistant Examiner* — Alexander J Yi
(74) *Attorney, Agent, or Firm* — Cermak Nakajima & McGowan LLP; Tomoko Nakajima (57) ABSTRACT

A touch sensor includes a sensor sheet that includes a plurality of sensor electrodes, wires that extend from the sensor electrodes, and a connection portion for connection to a substrate. The sensor sheet is formed with a body portion in which the sensor electrodes are formed, and a tail portion that projects from the body portion and that includes a terminal. A protective layer is stacked on at least a part of the tail portion. A folded portion in which the sensor sheet has been bent permanently is formed in the tail portion on which the protective layer is stacked.

13 Claims, 8 Drawing Sheets

(52) U.S. Cl.
CPC .............. *G06F 2203/04103* (2013.01); *H03K 2217/96078* (2013.01); *H03K 2217/960755* (2013.01); *H03K 2217/960765* (2013.01)

(56) References Cited

U.S. PATENT DOCUMENTS

| | | | |
|---|---|---|---|
| 2009/0096759 A1* | 4/2009 | Nishiwaki | G06F 3/041 345/173 |
| 2010/0225612 A1* | 9/2010 | Ishizaki | G02F 1/13338 345/174 |
| 2013/0029077 A1 | 1/2013 | Yoon | |
| 2013/0044443 A1 | 2/2013 | Yoshifusa | |
| 2014/0092041 A1* | 4/2014 | Ih | G06F 3/044 345/173 |
| 2014/0218053 A1* | 8/2014 | Ullmann | G06F 3/044 324/658 |
| 2015/0168997 A1* | 6/2015 | Matsuoka | G01C 21/265 345/174 |

FOREIGN PATENT DOCUMENTS

| | | |
|---|---|---|
| JP | 2013-041476 A | 2/2013 |
| JP | 2013-109520 A | 6/2013 |
| JP | 2013-247029 A | 12/2013 |
| JP | 2014-006865 A | 1/2014 |
| WO | WO2013/187324 A1 | 12/2013 |

OTHER PUBLICATIONS

International Search Report for PCT Patent App. No. PCT/JP2015/059992 (dated Apr. 28, 2015) with English language translation.
Office Action for Japanese Patent App. No. 2016-510582 (dated Jun. 14, 2019).
Office Action from Japanese Patent App. No. 2019-167452 (dated Jun. 2, 2020).

\* cited by examiner

TOUCH SENSOR

This application is a national phase entry under 35 U.S.C. § 371 of PCT Patent Application No. PCT/JP2015/059992, filed on Mar. 30, 2015, which claims priority under 35 U.S.C. § 119 to Japanese Patent Application No. 2014-068869, filed Mar. 28, 2014, both of which are incorporated by reference.

TECHNICAL FIELD

The present invention relates to a touch sensor for use for input operations etc. for various types of electronic devices.

BACKGROUND ART

There is a demand to widen the operation surface of electronic devices and the detection region of a touch sensor provided on the operation surface, while there is a high demand to reduce the size and space for the electronic devices. The touch sensor is formed using a resin film as a base material. The resin film is formed with an electrode formation portion in which sensor electrodes that serve as the detection region are formed, and a connection portion for conductive connection to wires that extend from the electrode formation portion and a circuit board. The wires and the connection portion significantly extend out of the operation surface. Therefore, the resin film is folded inward to be connected to the circuit board. Such a technology is described in Japanese Unexamined Patent Application Publication No. 2013-247029 (Patent Literature 1), for example.

CITATION LIST

Patent Literature

PTL 1: Japanese Unexamined Patent Application Publication No. 2013-247029

SUMMARY OF INVENTION

Technical Problem

However, the resin film which forms the touch sensor is relatively firm and has a strong force to return to its original state even if it is bent. Therefore, the touch sensor must be incorporated into the electronic device with the resin film pressed into a bent state, which degrades the workability. Besides the degraded workability, the resistance value at a wire portion at which the touch sensor is bent tends to be increased if the touch sensor is incorporated with the resin film forcibly bent, which may lower the detection accuracy.

The present invention has been made in view of the related art described above as the background. An object of the present invention is to facilitate incorporation of a touch sensor into an electronic device. Another object of the present invention is to suppress an increase in resistance value even if a touch sensor has a bent portion.

Solution to Problem

In order to achieve the foregoing objects, the present invention provides the following touch sensor.

That is, the present invention provides a touch sensor including a sensor sheet that has a plurality of sensor electrodes, a connection portion for connection to a substrate, and wires that extend from the sensor electrodes to the connection portion, characterized in that the sensor sheet has an electrode formation portion in which the sensor electrodes are formed, and an edge portion in which the wires and the connection portion are formed, and the edge portion has a protective layer and a folded portion in which the sensor sheet has been bent permanently along a folding line that passes through the protective layer.

With the edge portion of the sensor sheet having the protective layer and the folded portion in which the sensor sheet has been bent permanently along the folding line which passes through the protective layer, the electrode formation portion and the edge portion are stable with the edge portion placed as bent with respect to the electrode formation portion, rather than being placed in one plane. Therefore, it is possible to achieve a touch sensor that can be easily incorporated into a panel (housing) or the like of an electronic device.

In the present invention, the protective layer which is located in the folded portion may be provided at a position at which the protective layer does not overlap the wires. Providing the protective layer at a position at which the protective layer does not overlap the wires can reduce the influence of a pressure on the wires in the process of forming the folded portion, which can reduce an increase in resistance value of the wires. Such a protective layer can be provided adjacent to the wires, for example.

In the present invention, the protective layer which is located in the folded portion can be provided at a position at which the protective layer overlaps the wires. The protective layer can protect the wires. Providing the protective layer so as to overlap the wires can reduce the influence of heat on the wires in the process of forming the folded portion, which can reduce an increase in resistance value of the wires.

The protective layer which is provided at a position at which the protective layer overlaps the wires and the protective layer which is provided at a position at which the protective layer does not overlap the wires have the respective technical significances discussed earlier, and the present invention can further include a protective layer that has a combination of such technical significances.

In the present invention, the edge portion may be formed with a widened portion that is wider than the connection portion and that is narrower than the electrode formation portion, and the widened portion may be provided with the protective layer to form the folded portion. In the present invention, in which the widened portion is formed, a space for forming a protective layer over a large area can be secured to form a protective layer that is not easily peeled off.

In the present invention, the widened portion may be formed to be shaped so as to be widened from the connection portion toward the electrode formation portion. Providing such a radial widened portion can provide the wires more linearly with respect to the sensor electrodes, which can reduce the wiring distance from the sensor electrodes to the connection portion. Hence, the influence of noise can be reduced to improve the S/N ratio of the touch sensor. In addition, providing the wires radially in the radial widened portion increases the interval of the adjacent wires compared to a case where the wires are located densely. Therefore, air bubbles are not easily mixed between the protective layer and the sensor sheet when providing the protective layer on the wires. Thus, the influence of noise due to the air bubbles can be reduced to improve the S/N ratio of the touch sensor.

In the present invention, a resin film may be used for the protective layer. Use of the resin film facilitates adjustment of the thickness of the protective layer. Therefore, a protective layer with an optimum thickness matching a desired touch sensor can be provided easily.

In the present invention, the protective layer may have a thickness of 50 μm to 75 μm. The protective layer with a thickness of 50 μm to 75 μm can reduce the influence of heat on the wires in the process of forming the folded portion, which can suppress an increase in resistance value of the wires.

In the present invention, at least the sensor electrodes, the connection portion, and the wires may be provided on each of one surface and the other surface of the sensor sheet. Consequently, it is possible to achieve a touch sensor that enables coordinate input by a combination of the sensor electrodes on one surface and the sensor electrodes on the other surface while facilitating incorporation of the touch sensor into an electronic device.

The present invention also provides an electronic device that includes the touch sensor according to any aspect of the present invention. Consequently, it is possible to achieve an electronic device that facilitates incorporation of the touch sensor and that can suppress an increase in resistance value even if the touch sensor has a bent portion. In addition, the folded portion is provided at the edge portion of the sensor sheet, which enables incorporation of the touch sensor even if the edge portion of the panel (housing) of the electronic device is marginal. Therefore, the operation surface of the electronic device and the detection region of the touch sensor can be widened as much as possible in the vertical and horizontal directions of the panel (housing).

The present invention further provides the following method of manufacturing a touch sensor.

That is, the present invention provides a method of manufacturing a touch sensor constituted of a sensor sheet that includes a plurality of sensor electrodes, a connection portion for connection to a substrate, and wires that extend from the sensor electrodes to the connection portion, the sensor sheet having an electrode formation portion in which the sensor electrodes are formed, and an edge portion in which the wires and the connection portion are formed, the method being characterized by including stacking the sensor electrodes, the wires, and the connection portion on the sensor sheet which is planar, stacking a protective layer on at least a part of the edge portion, heating and folding the edge portion on which the protective layer has been stacked, and forming a folded portion in which the sensor sheet has been bent permanently.

The protective layer is provided, and the edge portion on which the protective layer has been stacked is heated and folded. Therefore, the touch sensor in which the sensor sheet has been bent permanently can be obtained. In addition, the sensor electrodes, the wires, and the connection portion can be easily formed by printing using the sensor sheet which is planar as a base material, which facilitates manufacture. In addition, the wires are protected by the protective layer. Therefore, the resistance value of the wires of the touch sensor obtained by the manufacturing method is not easily increased.

Advantageous Effects of Invention

The touch sensor according to the present invention, which has the folded portion which has been bent permanently, can be easily mounted to an electronic device to improve the workability. In addition, the touch sensor according to the present invention, in which the protective layer is provided on the folded portion which has been bent permanently, can suppress an increase in resistance value of the wires.

DESCRIPTION OF EMBODIMENTS

Embodiments of the present invention will be described below. Members that are common to the embodiments are denoted by the same reference numerals to omit redundant description. In addition, redundant description of common materials, functions, effects, and so forth will also be omitted.

First Embodiment (FIGS. 1 to 4)

Figure 1:
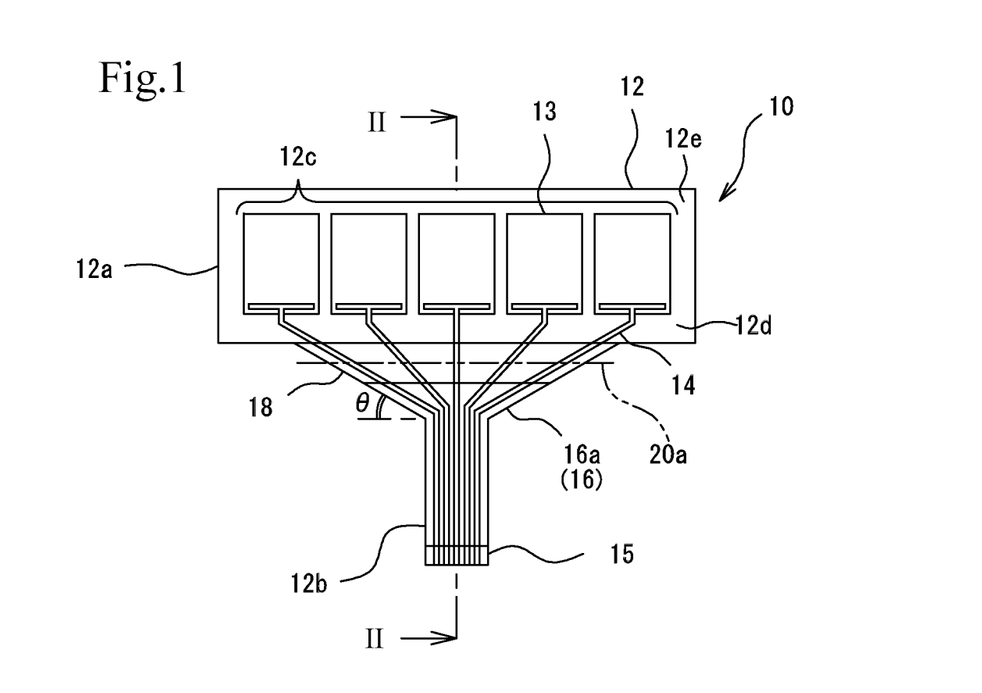
FIG. 1 is a plan view of a touch sensor according to a first embodiment before the formation of a folded portion.
Figure 3:
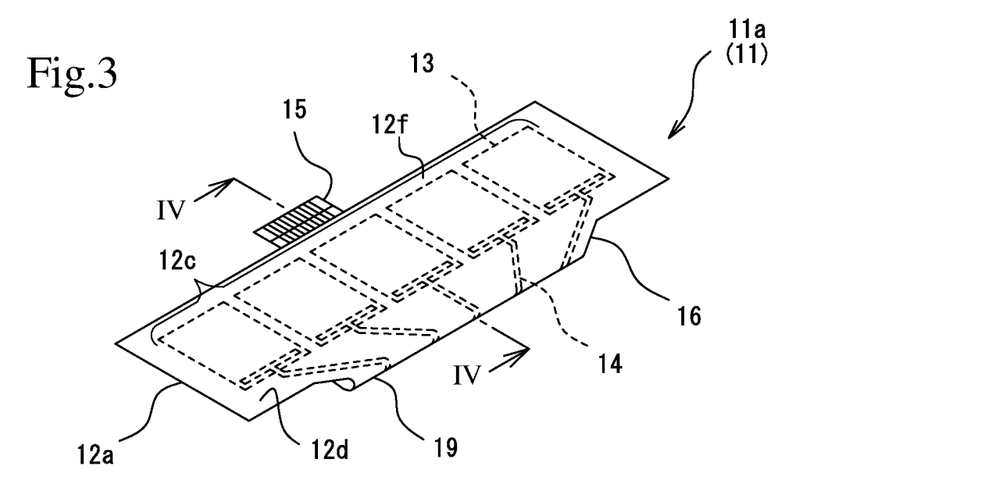
FIG. 3 is a perspective view of the touch sensor in which a (valley-folded) folded portion is formed with wires on the inner side.

In the embodiment, a touch sensor 11a, the edge portion of which has been folded as illustrated in FIG. 3, is described from a state in which the edge portion is not folded. FIG. 1 is a plan view illustrating a touch sensor 10 formed in a planar state. The touch sensor 10 includes a sensor sheet 12 constituted of a resin film, a plurality of (five in FIG. 1) sensor electrodes 13, wires 14 that extend from the sensor electrodes 13, and a connection portion 15 in which the wires 14 are located densely and connected to a circuit board.

The sensor sheet 12 has a rectangular body portion 12a in which the sensor electrodes 13 are provided, and a tail portion 12b that projects from the body portion 12a and that includes a terminal 15. The rectangular body portion 12a is formed with an electrode formation portion 12c in which the sensor electrodes 13 are formed, and an edge portion 12d which is located on the outer side of the electrode formation portions 12c and in which the wires 14 are formed. The tail portion 12b is a portion of the sensor sheet 12 in which the sensor electrodes 13 are not formed, and constitutes a part of the edge portion 12d of the sensor sheet 12 in addition to the edge portion 12d of the body portion 12a. The tail portion 12b is formed with a widened portion 16 that is wider than the connection portion 15 and that is narrower than the body portion 12a. In the embodiment, the widened portion 16 is formed as a widened portion 16 (radial widened portion 16a) radially widened from the connection portion 15 side toward the body portion 12a side. Therefore, the wires 14 which extend from the five sensor electrodes 13 pass through the widened portion 16 to be converged over a short distance to be connected to the terminal 15. The tail portion 12b is further formed with a band-shaped portion 17 that extends from one end side of the widened portion 16 to the connection portion 15. In the band-shaped portion 17, the wires 14 which are linear are formed to extend in parallel with each other at a narrow pitch. An end portion of the band-shaped portion 17 is connected to the connection portion 15.

Figure 2:
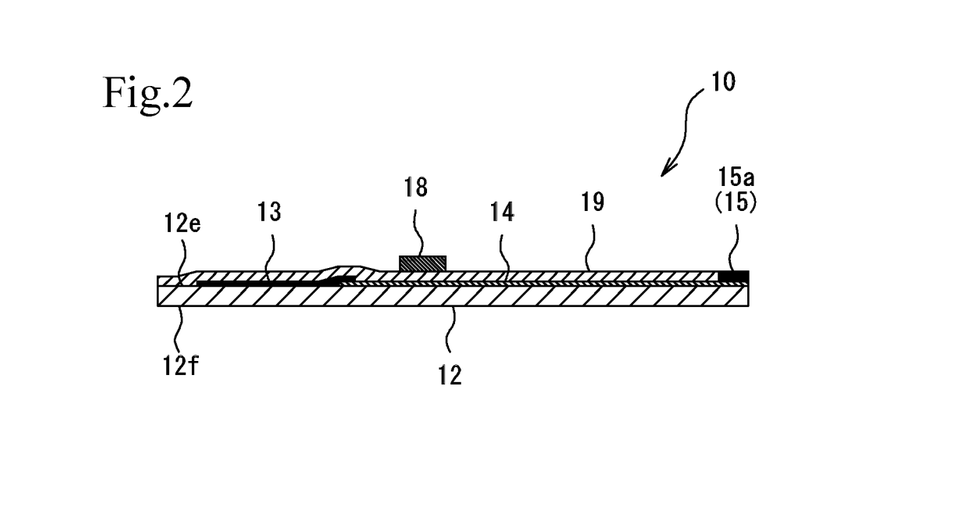
FIG. 2 is an enlarged sectional view taken along the line II-II of FIG. 1.

The stacked configuration of the touch sensor 10 is illustrated in the sectional view of FIG. 2. In the touch sensor 10, the wires 14 are provided on the sensor sheet 12, and the sensor electrodes 13 are provided so as to partially overlap the wires 14. A resist layer 19 is further stacked thereon. It should be noted, however, that the resist layer 19 is not formed, but a carbon print layer 15a is formed, on an end portion of the tail portion 12b that serves as the connection portion 15. A protective layer 18 is further formed on a part of the radial widened portion 16a as stacked on the resist layer 19. Such layers can be formed by printing or the like on the sensor sheet 12 which is constituted of a resin film.

Figure 4:
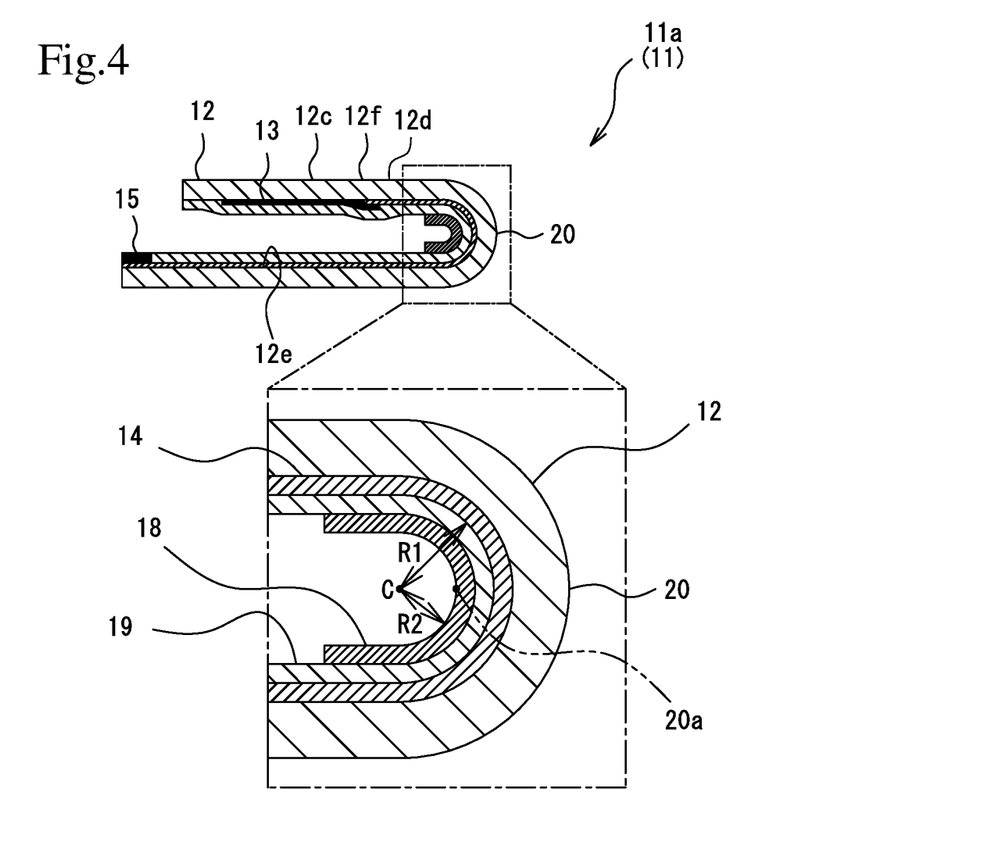
FIG. 4 is an enlarged sectional view taken along the line IV-IV of FIG. 3.

As illustrated in FIGS. 1, 3, and 4, the touch sensor 10 is formed into the touch sensor 11a by folding the tail portion 12b at a folding line 20a. A folded portion 20 is formed by folding (valley-folding) the touch sensor 11a with the side on which the wires 14 are stacked on the stacked sheet 12 serving as the inner side, and bending a portion of the tail portion 12b on which the protective layer 17 is provided by 180° along the folding line 20a. The folded portion 20 can be formed by heating and folding the portion to be bent. The folded state is maintained even if the folded portion 20 is not pressed. That is, the folded portion 20 is bent permanently.

Next, the material, function, etc. of the components which form the touch sensor 11a will be described.

The sensor sheet 12 is a base material of the touch sensor 11a, and can be formed using a transparent resin film in the case where transparency is required. When transparency is required for the sensor sheet 12, it is required that display provided on the back surface (on the side of an inside surface 12e of the sensor sheet 12 which has been formed with the folded portion 20) of the touch sensor 11a should be visually recognizable from the front surface of the touch sensor 11 (on the side of an outside surface 12f of the sensor sheet 12 which has been formed with the folded portion 20).

The resin film is preferably constituted of a thermoplastic resin. This is because the folded portion 20 which has been bent permanently can be formed easily by heating and shaping the thermoplastic resin. Examples of the material of such a resin film include a polyethylene terephthalate (PET) resin, a polyethylene naphthalate (PEN) resin, a polycarbonate (PC) resin, a polymethyl methacrylate (PMMA) resin, a polypropylene (PP) resin, a polyurethane (PU) resin, a polyamide (PA) resin, a polyether sulfone (PES) resin, a polyether ether ketone (PEEK) resin, a triacetyl cellulose resin (TAC) resin, a polyimide (PI) resin, and a cycloolefin polymer (COP).

The thickness of the sensor sheet 12 is preferably 10 μm to 200 μm in order to retain the shape of the touch sensor 11a. The sensor sheet 12 can be provided with a primer layer that enhances the adhesion to a conductive polymer, a surface protective layer, an overcoat layer for anti-static or other purposes, and so forth to be subjected to surface processing.

The sensor electrodes 13 are constituted of a conductive layer that includes conductive ink or a conductive polymer. If the conductive polymer is used, the sensor electrodes 13 do not easily lose their conductivity and can be disposed on a display panel P or function as the sensor electrodes 13 which can emit light even if the sensor electrodes 13 are expanded when the touch sensor 11a is integrally formed with a panel B (housing) (see FIG. 5). Another advantage is that an application liquid in the liquid form can be formed to form the sensor electrodes 13 by printing, which allows the sensor electrodes 13 to be obtained inexpensively compared to ITO or the like. In the case where transparency is not necessary, the sensor electrodes 13 can be formed using conductive ink such as silver ink or carbon paste. The silver ink is preferable in that sensor electrodes 13 with a low resistance and a high sensitivity can be formed. Meanwhile, the carbon paste is preferable in that sensor electrodes 13 can be obtained inexpensively compared to the conductive polymer, and in being weather-resistant.

A conductive polymer that can form a transparent layer is used as the material of the conductive polymer which forms the sensor electrodes 13. Examples of such a transparent conductive polymer include polyparaphenylene, polyacethylene, and PEDOT-PSS (poly-3,4-ethylenedioxythiophene-polystyrene sulfonate).

The layer thickness of the sensor electrodes 13 is preferably 0.04 μm to 1.0 μm, more preferably 0.06 μm to 0.4 μm. If the layer thickness is less than 0.04 μm, the resistance value of the sensor electrodes 13 may be too high. If the layer thickness is more than 1.0 μm, the transparency may be too low. The layer thickness of the sensor electrodes 13 can be measured using an atomic force microscope (AFM) by forming the sensor electrodes 13 on the sensor sheet 12.

The wires 14 conductively connect the sensor electrodes 13 to a circuit board of an electric device that includes the touch sensor 11 through the connection portion 15. The wires 14 are preferably formed from conductive paste or conductive ink that contains a highly conductive metal such as copper, aluminum, silver, and alloys that contain such metals. Among these, silver wires are preferable for the reason of being more conductive than other metals and alloys and being less easily oxidized than copper.

The thickness of the wires 14 is preferably 1.0 μm to 20 μm. If the thickness is less than 1.0 μm, the resistance value of the wires tends to be increased to possibly cause noise. If the thickness of the wires 14 is more than 20 μm, on the other hand, a large step is formed, which increases the possibility that air bubbles are mixed when applying the resist layer.

The resistance value of the wires 14 is preferably 300Ω or less. If the resistance value is more than 300Ω, noise may be increased to degrade sensitivity.

The connection portion 15 can be formed by covering the distal ends of the wires 14 with carbon ink.

The resist layer 19 is an insulating coating provided to prevent conduction between the sensor electrodes 13 and to protect the sensor electrodes 13 from ultraviolet rays, a scratch, and so forth. The resist layer 19 is required to be transparent. The resist layer 19 is also suitable to prevent sulfuration of the wires 14 which are constituted of silver paste or a metal.

A hard resin is selected as the resin which forms the resist layer 19. Examples of the resin include acrylic, urethane, epoxy, polyolefin, and other resins.

The thickness of the resist layer 19 is normally 6 µm to 30 µm, preferably 10 µm to 20 µm. If the thickness is more than 30 µm, the resist layer 19 is not very flexible. If the thickness is less than 6 µm, the sensor electrodes 13 may not be protected sufficiently.

The protective layer 18 is a resin layer provided to protect the wires 14 when forming the folded portion 20. Examples of the protective layer 18 include acrylic, urethane, epoxy, polyolefin, and other resins, and a resin film such as a polyethylene terephthalate (PET) resin, a polyethylene naphthalate (PEN) resin, a polycarbonate (PC) resin, a polymethyl methacrylate (PMMA) resin, a polypropylene (PP) resin, a polyurethane (PU) resin, a polyamide (PA) resin, a polyether sulfone (PES) resin, a polyether ether ketone (PEEK) resin, a triacetyl cellulose resin (TAC) resin, a polyimide (PI) resin, and a cycloolefin polymer (COP). Among such materials, use of a resin film constituted of a thermoplastic resin is particularly preferable. Use of the same material as that of the sensor sheet 12 is more preferable. This is because optimum folding conditions that match the material can be set when forming the folded portion 20 if the same material is used. If materials with significantly different thermal properties are used in combination for the sensor sheet 12 and the protective layer 18, on the contrary, peeling or the like may be caused with one of the materials deformed significantly while the other material is not bent permanently, for example.

The thickness of the protective layer 18 is preferably at least more than 30 µm, more preferably 50 µm to 75 µm. This is because the wires 14 may be damaged by the formation of the folded portion 20 if the thickness is less than 30 µm, and variations in resistance value of the wires between before and after the formation of the folded portion 20 can be reduced if the thickness is 50 µm to 75 µm. If the thickness is more than 75 µm, the resistance value may be too large.

As illustrated in the enlarged view of FIG. 4, when the distance from a folding center C to the wires 14 is defined as a wire radius R1 and the distance from the folding center C to the surface of the protective layer 18 is defined as a folding radius R2, the wire radius R1 can be increased by an amount corresponding to the thickness of the protective layer 18 even if the folding radius R2 is small. Thus, if the thickness of the protective layer 18 is small, the wire radius R1 is reduced, which increases the resistance value of the wires 14 and also increases the possibility of a wire break. If the thickness of the protective layer 18 is more than 30 µm, however, the wire radius R1 can be increased even if the folding radius R2 is small, which can suppress an increase in resistance value of the wires 14. This is particularly effective in the case where the folding radius R2 is small.

However, the thickness of the protective layer 18 is preferably less than 100 µm. This is because the resistance value of the wires 14 may be increased also in the case where the thickness of the protective layer 18 is 100 µm or more. The reason is that the wires 14 are expanded by the formation of the folded portion 20 if the wire radius R1 is too large compared to the folding radius R2. If the wires 14 are expanded, it is considered that the distance between particles of the highly conductive metal contained in the wires 14 is increased and the thickness of the wires 14 is reduced.

It is desired that the widened portion 16 should be shaped to be at least wider than the connection portion 15 and narrower than the body portion 12a. However, the widened portion 16 is preferably shaped such that the length of the wires 14 from the sensor electrodes 13 to the connection portion 15 can be shortened and there are few extra portions. The radial widened portion 16a according to the embodiment meets such requirements, and is preferable. The radially widened shape is formed such that the widening angle θ (see FIG. 1) is about 20° to 70° depending on the width of the connection portion 15 and the width of the body portion 12a.

If the length of the wires 14 is reduced by forming the widened portion 16, disadvantages such as generation of noise due to the long wires 14 can be suppressed. In addition, the wires 14 which are disposed in the widened portion 16 are preferable in that the interval of the wires 14 can be increased. If the interval of the wires 14 is small, the wires 14 are located densely and recesses and projections are formed in the wiring pattern, which may cause a disadvantage in which air bubbles are mixed when providing the protective layer 18. If the interval of the wires 14 is large, however, mixing of air bubbles can be suppressed to suppress generation of noise due to the mixing of air bubbles.

The folded portion 20 is formed in the widened portion 16 which is protected by the protective layer 18. In the embodiment, the folded portion 20 is folded by 180° with the folding radius R2. The folding radius R2 is not specifically limited, but is preferably 100 µm or more. This is because the resistance value of the wires 14 may be increased and a wire break may be caused if the folding radius R2 is less than 100 µm. Meanwhile, the upper limit of the folding radius R2 is not provided because of the resistance value properties. However, a larger folding space is required as the folding radius R2 is larger. The folding angle can be determined as a predetermined angle in accordance with the specifications of the electronic device to which the touch sensor 11a is to be mounted.

As illustrated in FIG. 4, the folded portion 20 is in a curved shape with the folding radius R2. However, the folded portion 20 may be in a folded shape in which two surfaces are orthogonal to each other with the folding radius R2 being "0". It should be noted, however, that the folding radius R2 is preferably provided, no matter how small it may be, in order to protect the wires 14. The folded portion 20 can be formed by being interposed between heated dies to be folded, or placing an end of a thin plate-like object into contact with the tail portion 12b and folding the tail portion 12b about the contact point. It is required that the folded portion 20 should be bent permanently at a desired folding angle, and it is preferable to form the folded portion 20 while being heated and pressurized in order to permanently bend the folded portion 20.

Figure 5:
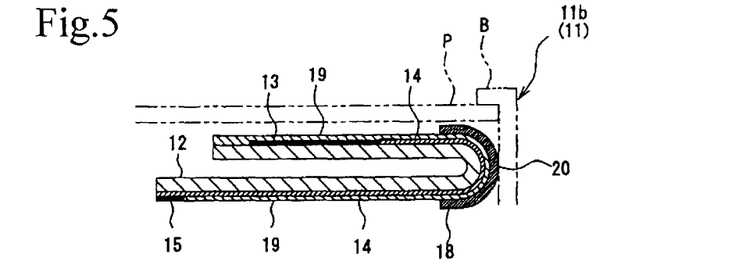
FIG. 5 is a sectional view corresponding to FIG. 4, illustrating a touch sensor according to Modified Example 1.
Figure 6:
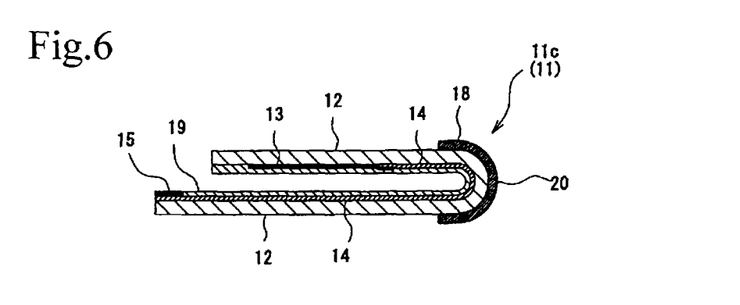
FIG. 6 is a sectional view corresponding to FIG. 4, illustrating a touch sensor according to Modified Example 2.
Figure 7:
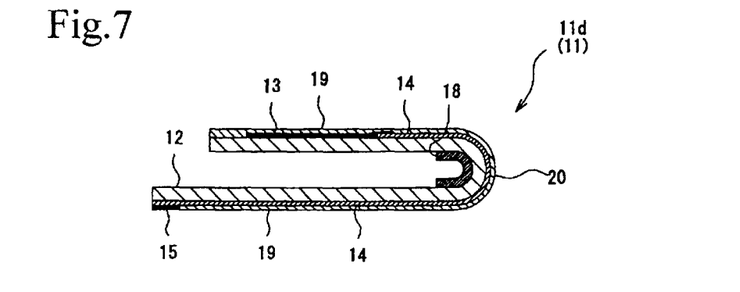
FIG. 7 is a sectional view corresponding to FIG. 4, illustrating a touch sensor according to Modified Example 3.

Modified Examples 1 to 3 [FIGS. 5 to 7]

In the embodiment described above, the tail portion 12b is folded in a "valley-folded" configuration, in which the tail portion 12b is folded with a surface (inside surface 12e) of the sensor sheet 12 on which the wires 14 are stacked on the inner side. However, the tail portion 12b may be folded in a "mountain-folded" configuration, in which the tail portion 12b is folded with a surface (outside surface 12f) on which the wires 14 are stacked on the outer side. FIG. 5 is a sectional view illustrating a touch sensor 11b according to Modified Example 1 in which the folded portion 20 is formed by being mountain-folded.

In both the touch sensors 11a and 11b, the protective layer 18 is provided on the same side as a surface of the sensor sheet 12 on which the wires 14 are stacked. However, only the protective layer 18 may be provided on the side opposite to the surface of the sensor sheet 12 on which the wires 14 are provided. FIG. 6 illustrates a touch sensor 11c according to Modified Example 2, which is an example in which the protective layer 18 is provided on the side opposite to the wires 14 and which has been valley-folded. In addition, FIG. 7 illustrates a touch sensor 11d according to Modified Example 3, which is an example in which the protective layer 18 is provided on the side opposite to the wires 14 and which has been mountain-folded.

The touch sensor 11b illustrated in FIG. 5 and the touch sensor 11c illustrated in FIG. 6, in which the tail portion 12b is folded with the protective layer 18 located on the outer side, also have the effect of suppressing expansion of the wires 14. Also in mountain-folded touch sensors such as the touch sensor 11b illustrated in FIG. 5 and the touch sensor 11d illustrated in FIG. 7, the sensor sheet 12 has a constant thickness. Therefore, the curve radius R1 is not excessively small, which provides the effect of suppressing expansion of the wires 14.

Figure 8:
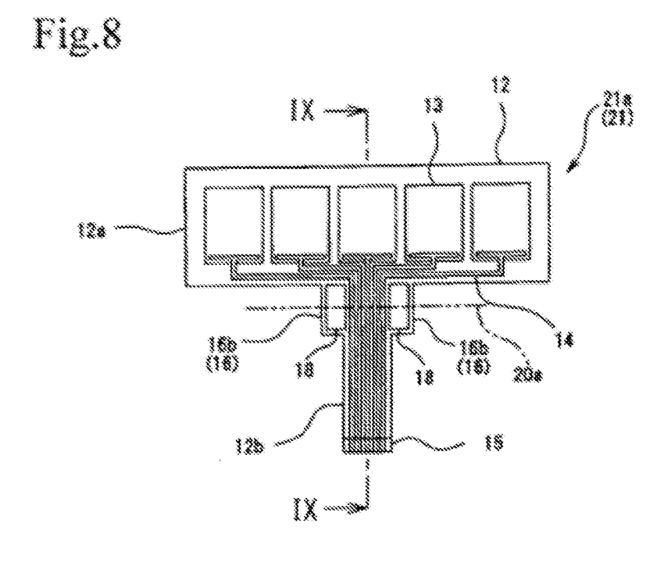
FIG. 8 is a plan view corresponding to FIG. 1, illustrating a touch sensor according to a second embodiment.
Figure 9:
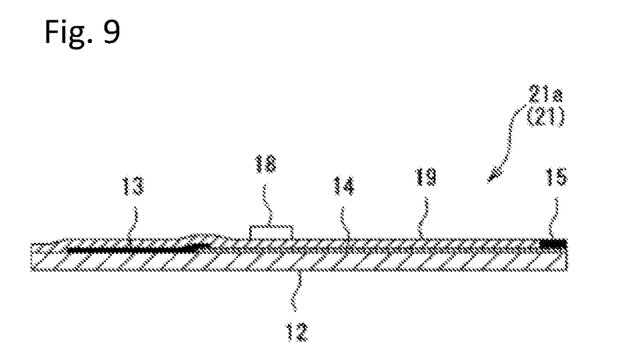
FIG. 9 is an enlarged sectional view taken along the line IX-IX of FIG. 8.

Second Embodiment [FIGS. 8 and 9]

A touch sensor 21 according to a second embodiment will be described with reference to FIGS. 8 and 9. Although FIGS. 8 and 9 illustrate a touch sensor 21a formed in a planar shape before the formation of the folded portion 20, the touch sensor 21 can be obtained by forming the folded portion 20 along the folding line 20a as in the first embodiment.

The touch sensor 21a according to the embodiment is different from the touch sensor 11 described in relation to the preceding embodiment in the shape of the widened portion 16, that is, in that a rectangular widened portion 16b is provided in place of the radial widened portion 16a. The rectangular widened portion 16b is a rectangular portion formed on the side of the boundary of the tail portion 12b with the body portion 12a to be wider than the connection portion 15. The protective layer 18 is formed on a transversely widened portion of the rectangular portion in which the wires 14 do not pass. Therefore, the protective layer 18 does not overlap the wires 14, and does not cover the wires. The touch sensor 21 which has the folded portion 20 which has been bent permanently can be obtained by mountain-folding or valley-folding the thus configured touch sensor 21a.

Also in the configuration in which the rectangular widened portion 16b is provided, a space is formed for an amount corresponding to the thickness of the protective layer 18 on the inner side (valley side) of the wires 14 in the case where the sensor sheet 12 is valley-folded. This allows inward deformation and makes it difficult for the wires 14 to be expanded, which suppresses an increase in resistance value. When forming the folded portion 20, in addition, a pressure concentrates on the rectangular widened portion 16b which is provided with the protective layer 18, which reduces the load to be imposed on the wires 14. For the wires 14 which are formed from a copper foil or the like which is not easily collapsed compared to the protective layer 18 or the sensor sheet 12, the resistance value is not easily increased even if a pressure concentrates thereon. For the wires 14 which are formed from conductive paste that contains silver ink or a resin such as a conductive polymer, the resistance value tends to be increased when the wires 14 are collapsed by a pressure, and reducing the burden to be imposed on the wires 14 can achieve a remarkable effect of suppressing an increase in resistance value.

Figure 10:
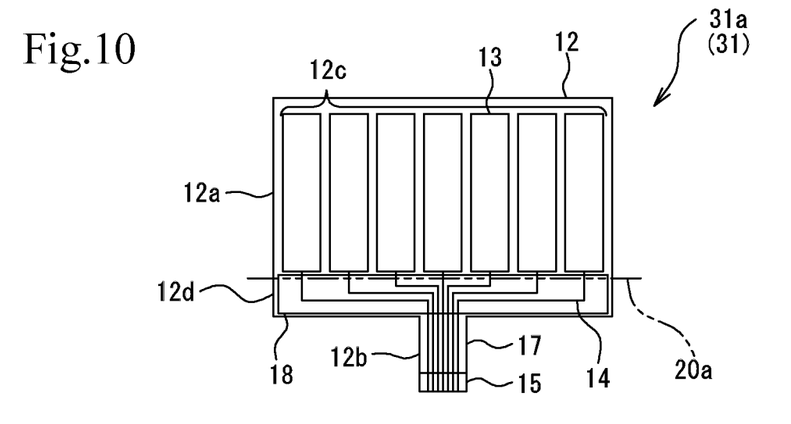
FIG. 10 is a plan view corresponding to FIG. 1, illustrating a touch sensor according to a third embodiment.

Third Embodiment [FIG. 10]

A touch sensor 31 according to a third embodiment will be described with reference to FIG. 10. Although FIG. 10 illustrates a touch sensor 31a formed in a planar shape before the formation of the folded portion 20, the touch sensor 31 can be obtained by forming the folded portion 20 along the folding line 20a as in the first embodiment.

The sensor sheet 12 according to the embodiment differs from that according to the first embodiment in that the tail portion 12b which projects from the body portion 12a is not formed with the widened portion 16. In the sensor sheet 12 according to the embodiment, the wires 14 which extend from the sensor electrodes 13 are formed in the "edge portion" on the outer side of the electrode formation portion 12c. That is, the wires 14 are formed to be connected to the connection portion 15 through the edge portion 12d of the body portion 12a, which serves as the "edge portion", and the band-shaped portion 17 of the tail portion 12b. The protective layer 18 is formed on the edge portion 12d.

In the touch sensor 31, the folding line 20a is provided in the edge portion 12d of the body portion 12a adjacent to the sensor electrodes 13 (electrode formation portion 12c), and the folded portion 20 is formed along the folding line 20a. Thus, the sensor electrodes 13, which serve as the detection region of the touch sensor 31, can be provided in proximity to the outer edge of the housing B of the electronic device in which the touch sensor 31 is to be installed. Therefore, the area of the operation surface P of the display panel can be increased while reducing the size of the electric device.

Figure 11:
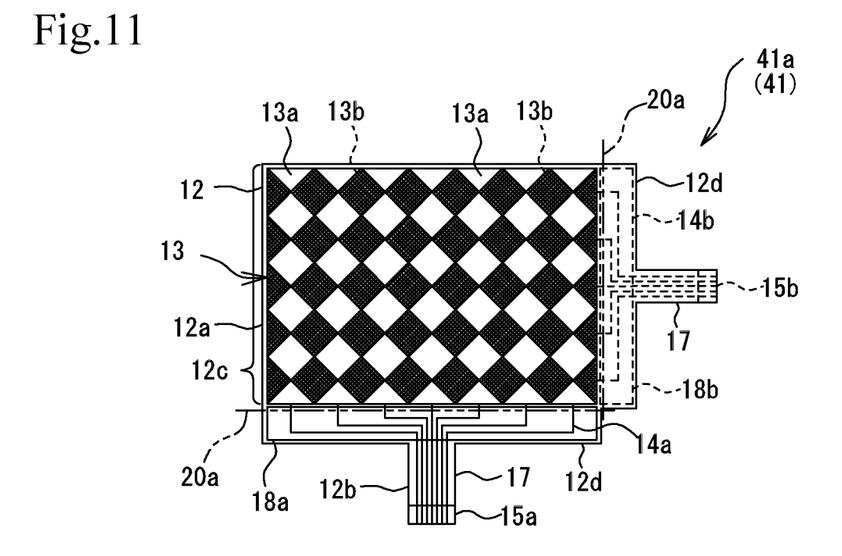
FIG. 11 is a plan view corresponding to FIG. 1, illustrating a touch sensor according to a fourth embodiment.

Fourth Embodiment [FIG. 11]

A touch sensor 41 according to a fourth embodiment will be described with reference to FIG. 11. Although FIG. 11 illustrates a touch sensor 41a formed in a planar shape before the formation of the folded portion 20, the touch sensor 41 can be obtained by forming the folded portion 20 along the folding line 20a at two locations as in the first embodiment.

The sensor sheet 12 according to the embodiment is formed with the body portion 12a and two tail portions 12b. Sensor electrodes 13a, wires 14a, a connection portion 15b, a protective layer 18a, and a resist layer 19a (not illustrated) are formed on one surface (front surface) of the sensor sheet 12. On the other hand, sensor electrodes 13b, wires 14b, a connection portion 15c, a protective layer 18b, and a resist layer 19b (not illustrated) are formed on the other surface (back surface) of the sensor sheet 12. The touch sensor 41 which enables coordinate input is achieved by a combination of the sensor electrodes 13a on one surface and the sensor electrodes 13b on the other surface. The sensor electrodes 13a and 13b are both formed as a conductive paint film formed in a tile pattern in which the corner portions of squares are connected to each other. In FIG. 11, the sensor electrodes 13b are colored in black for distinction between the sensor electrodes 13a and 13b.

Also in the sensor sheet 12 according to the embodiment, the sensor electrodes 13 are formed in the electrode formation portion 12c, and the wires 14a and 14b and the connection portions 15b and 15c are formed in two edge portions 12d of the body portion 12a, which serve as the "edge portion", and the band-shaped portions 17 of the two tail portions 12b. The resist layers 19a and 19b are formed on the respective surfaces of the sensor sheet 12 so as to cover the sensor electrodes 13 and the wires 14. The protective layers 18 are formed on respective surfaces of the edge portions 12d on which the wires 14a and 14b are formed.

In the touch sensor 41, the folding line 20a is provided in the edge portion 12d of the body portion 12a adjacent to the sensor electrodes 13 (electrode formation portion 12c), and the folded portion 20 is formed along the folding line 20a. Thus, the sensor electrodes 13, which serve as the detection region of the touch sensor 41, can be provided in proximity to the outer edge of the housing B of the electronic device in which the touch sensor 41 is to be installed. Therefore, the area of the operation surface P of the display panel can be increased while reducing the size of the electric device. In addition, the touch sensor 41 which enables coordinate input is achieved by a combination of the sensor electrodes 13a on one surface and the sensor electrodes 13b on the other surface.

Figure 12:
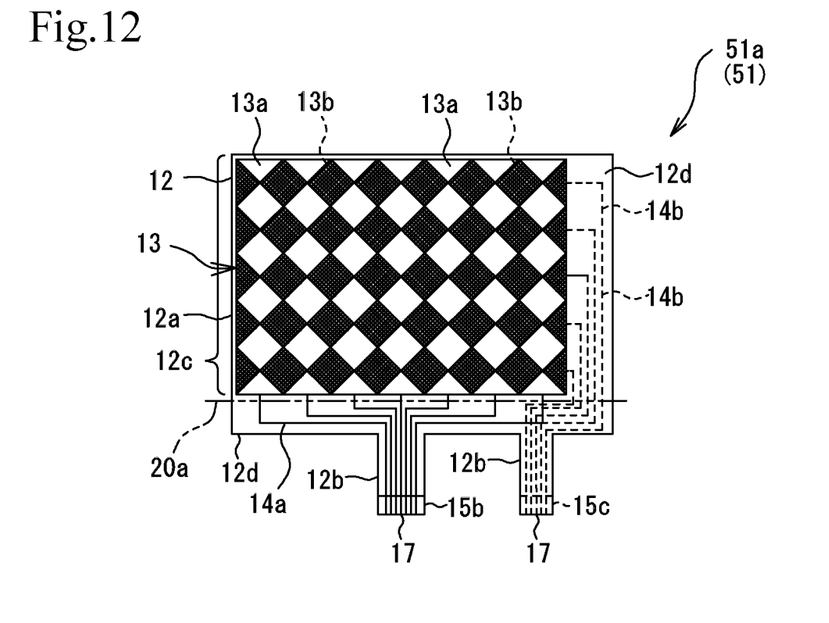
FIG. 12 is a plan view corresponding to FIG. 1, illustrating a touch sensor according to a fifth embodiment.
Figure 13:
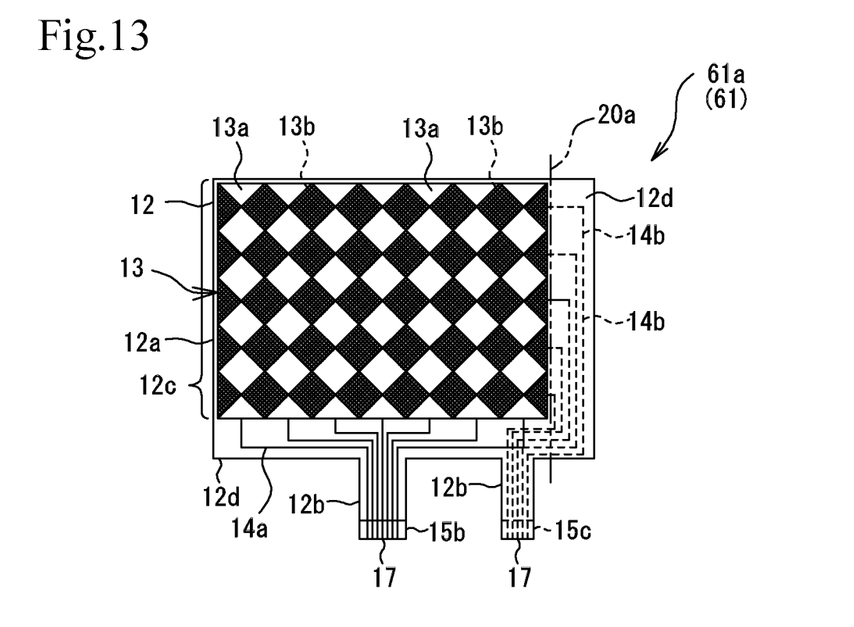
FIG. 13 is a plan view illustrating a touch sensor according to a modification of the fifth embodiment.
Figure 14:
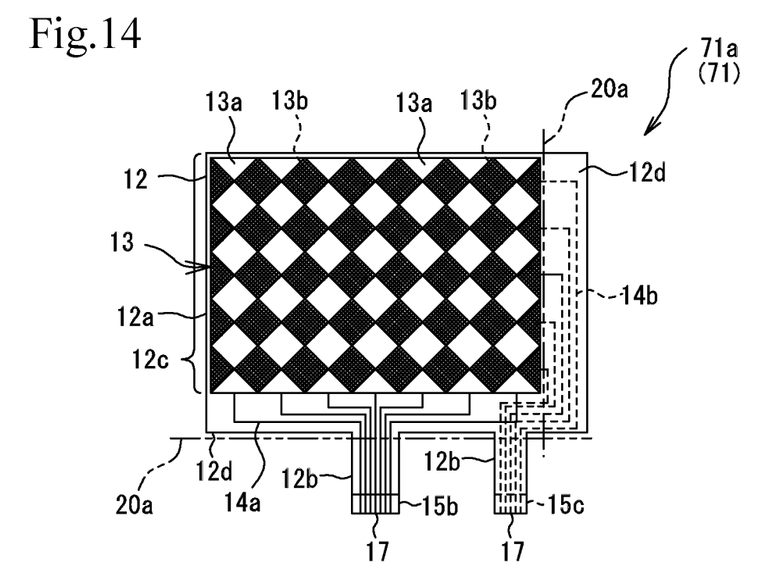
FIG. 14 is a plan view illustrating a touch sensor according to another modification of the fifth embodiment.

Fifth Embodiment [FIGS. 12, 13, and 14]

A touch sensor 51 according to a fifth embodiment will be described with reference to FIG. 12. Although FIG. 12 illustrates a touch sensor 51a formed in a planar shape before the formation of the folded portion 20, the touch sensor 51 can be obtained by forming the folded portion 20 along the folding line 20a as in the first embodiment.

In the sensor sheet 12 according to the embodiment, as in the fourth embodiment, the sensor electrodes 13a and 13b, the wires 14a and 14b, the connection portions 15b and 15c, the protective layers 18a and 18b, and the resist layers 19a and 19b (not illustrated) are formed on one surface (front surface) and the other surface (back surface), respectively, of the sensor sheet 12. In order to avoid complication of the drawing, the protective layer 18b is not illustrated. However, the body portion 12a according to the embodiment differs from that according to the fourth embodiment in that the tail portions 12b are formed adjacent to each other on one side of the body portion 12a.

In the touch sensor 51, the folding line 20a is provided in the edge portion 12d of the body portion 12a adjacent to the sensor electrodes 13 (electrode formation portion 12c), and the folded portion 20 is formed along the folding line 20a. Thus, the sensor electrodes 13, which serve as the detection region of the touch sensor 51, can be provided in proximity to the outer edge of the housing B of the electronic device in which the touch sensor 51 is to be installed. Therefore, the area of the operation surface P of the display panel can be increased while reducing the size of the electric device. In addition, the touch sensor 51 which enables coordinate input is achieved by a combination of the sensor electrodes 13a on one surface and the sensor electrodes 13b on the other surface. With the tail portions 12b formed on one side of the body portion 12a, further, the edge portions 12d do not overlap each other when the edge portions 12d are folded, which can reduce the height of the touch sensor 51. In the case where the connection portions 15b and 15c are connected to an FPC connector or the like mounted on a circuit board, in addition, the connection portions 15b and 15c can be inserted from the same direction to be fitted, which facilitates the connection work.

In the touch sensor 51, the folding line 20a may be set as in a touch sensor 61a according to a modification illustrated in FIG. 13. That is, in the touch sensor 61a, the folding line 20a is set in the edge portion 12d in which no tail portions 12b are provided, and the folded portion 20 is formed along the folding line 20a to constitute the touch sensor 61. Consequently, the sensor electrodes 13, which serve as the detection region of the touch sensor 61, can be provided in proximity to the outer edge of the housing B of the electronic device in which the touch sensor 61 is to be installed. Therefore, the area of the operation surface P of the display panel can be increased while reducing the size of the electric device. In particular, three sides of the sensor electrodes 13 can be provided in proximity to the outer edge of the housing B. In addition, coordinate input is enabled by a combination of the sensor electrodes 13a on one surface and the sensor electrodes 13b on the other surface.

In the touch sensor 51, further, folding lines 20a may be set as in a touch sensor 71a according to a modification illustrated in FIG. 14. That is, in the touch sensor 71a, one of the folding lines 20a is set in the edge portion 12d in which no tail portions 12b are provided, and the folded portion 20 is formed along the folding line 20a to constitute the touch sensor 71. In addition, the other folding line 20a is set so as to pass over the two tail portions 12b, and the folded portion 20 is formed at the projection base portions of the tail portions 12b. With the touch sensor 71, the area of the operation surface P of the display panel can be increased as with the touch sensor 61a discussed earlier, and coordinate input is enabled. Further, the touch sensor 71 in which the tail portions 12b do not project from the body portion 12a can be achieved.

EXAMPLES

Experimental Example 1

A stacked sheet shaped and configured as illustrated in FIGS. 1 and 2 was fabricated. More specifically, a transparent PET film with a thickness of 100 μm was used for a resin film for a sensor sheet, transparent conductive ink (Clevios SV3 manufactured by Heraeus) was used for sensor electrodes, silver ink (FA-333 manufactured by Fujikura Kasei Co., Ltd.) was used for wires, and transparent polyurethane resin ink was used for a resist layer to form respective layers by screen printing. In addition, a connection portion was formed by printing using carbon ink to cover the distal ends of the wires. The longitudinal length of the sensor sheet was 155 mm, the width of the connection portion was 30 mm, the length of the boundary portion between the body portion and the widened portion (tail portion) was 65 mm, the length from one end of the widened portion to the boundary with the body portion was 15 mm, the thickness of the wires was 8 μm, and the thickness of the resist layer was 8 μm.

The stacked sheet for a sample 1A was obtained in this manner. Further, a protective layer was formed on the same side of the stacked sheet as the wires using one of PET films with an adhesive layer on one side with different thicknesses. A protective layer with a thickness of 50 μm was defined as a sample 1C (no sample 1B was present), a protective layer with a thickness of 75 μm was defined as a sample 1D, a protective layer with a thickness of 100 μm was defined as a sample 1E, and a protective layer with a thickness of 125 μm was defined as a sample 1F.

The thus obtained five samples 1A, 1C, 1D, 1E, and 1F were valley-folded as illustrated in FIG. 4 to provide a folded portion to fabricate five touch sensors illustrated in FIG. 3, namely a sample 1A valley, a sample 1C valley, a sample 1D valley, and a sample 1E valley. In addition, the five samples 1A, 1C, 1D, 1E, and 1F were mountain-folded as illustrated in FIG. 5 to provide a folded portion to fabricate five touch sensors illustrated in FIG. 4, namely a sample 1A mountain, a sample 1C mountain, a sample 1D mountain, a sample 1E mountain, and a sample 1F mountain.

The resistance value was measured before and after the formation of the folded portion for evaluation samples that simulated the folded portion of each sample, and variations in resistance value were indicated by % in the following Table 1. More specifically, the evaluation samples were fabricated by providing two contact points for measurement on a transparent PET film with a thickness of 100 µm, providing a wire with a width of 1 mm and a length between the contact points of 25 mm so as to connect the contact points for measurement to each other, and providing a resist layer and a protective layer so as to correspond to the samples described above except that no sensor electrodes or no connection portion were formed. Thus, the evaluation samples were the same in material and thickness as the samples, except that no sensor electrodes or no connection portion were provided. For the evaluation samples, the initial resistance value between the contact points was measured, and thereafter the resistance value after the formation of a folded portion was measured after a folded portion was formed at the middle portion of the wire. The rate of variation in resistance value between before and after the folding was calculated using the thus measured resistance values.

TABLE 1

|  | Protective layer thickness (µm) | Resistance value variation rate (%) |
|---|---|---|
| Sample 1A valley | 0 | 368 |
| Sample 1C valley | 50 | 214 |
| Sample 1D valley | 75 | 248 |
| Sample 1E valley | 100 | 562 |
| Sample 1F valley | 125 | 580 |
| Sample 1A mountain | 0 | 378 |
| Sample 1C mountain | 50 | 220 |
| Sample 1D mountain | 75 | 200 |
| Sample 1E mountain | 100 | 284 |
| Sample 1F mountain | 125 | 296 |

As seen from Table 1, the resistance value was increased less for the sample 1C valley, the sample 1D valley, the sample 1C mountain, the sample 1D mountain, the sample 1E mountain, and the sample 1F mountain than the sample 1A valley and the sample 1A mountain in which no protective layer was provided. From the above, it was found that, for the configurations in which the sample was valley-folded and the protective layer was provided on the inner side, an increase in resistance value was suppressed significantly by providing the protective layer with a thickness of 50 µm to 75 µm, while an increase in resistance value was more significant when the thickness of the protective layer was 100 µm or more than when no protective layer was provided. For the configurations in which the sample was mountain-folded and the protective layer was provided on the outer side, meanwhile, the effect of suppressing an increase in resistance value was observed in all the cases with the different thicknesses of the protective layer, and the effect was particularly remarkable when the thickness of the protective layer was 50 µm to 75 µm.

Experimental Example 2

In Experimental Example 2, polyurethane resin ink that was the same as that for the resist layer was formed to a predetermined film thickness by printing to be used as a protective layer, in place of the protective layer which was formed from a PET film and used in Experimental Example 1. The tail portion was valley-folded to constitute touch sensors, namely a sample 2A valley, a sample 2B valley, a sample 2C valley, a sample 2D valley, and a sample 2F valley (no sample 2E was present). The resistance value was measured before and after the formation of the folded portion for the samples, and variations in resistance value were indicated by % in the following Table 2.

TABLE 2

|  | Protective layer thickness (µm) | Resistance value variation rate (%) |
|---|---|---|
| Sample 2A valley | 0 | 360 |
| Sample 2B valley | 10 | 368 |
| Sample 2C valley | 50 | 275 |
| Sample 2D valley | 75 | 179 |
| Sample 2F valley | 125 | Wire break |

As seen from Table 2, the resistance value was increased less for the sample 2C valley and the sample 2D valley than for the sample 2A valley in which no protective layer was provided. With the experimental example, it was found that the protective layer with a thickness 10 µm did not have the effect of suppressing the resistance value. When the results of Experimental Example 2 were contrasted with the results of Experimental Example 1 described earlier, it was found that an increase in resistance value was suppressed significantly when the thickness of the protective layer was 50 to 75 µm as in Experimental Example 1, while no effect of suppressing an increase in resistance value was obtained when the thickness of the protective layer was 125 µm.

Experimental Example 3

Experimental Example 3 was conducted with the protective layer disposed differently. In the sample 1A indicated in Experimental Example 1, a protective layer constituted of a PET film with a thickness of 50 µm was provided on a surface of the sensor sheet opposite to the surface on which the wires and the sensor electrodes were provided, the tail portion was valley-folded to fabricate a sample 3C valley illustrated in FIG. 6, and the tail portion was mountain-folded to fabricate a sample 3C mountain illustrated in FIG. 7. Variations in resistance value were evaluated as in the experimental examples described earlier.

The following Table 3 indicates variations in resistance value for the sample 3C valley and the sample 3C mountain together with variations in resistance value for the sample 1C valley and the sample 1C mountain according to Example 1 and the sample 2C valley according to Example 2.

TABLE 3

|  | Sample 1C valley | Sample 1C mountain | Sample 2C valley | Sample 3C valley | Sample 3C mountain |
|---|---|---|---|---|---|
| Protective layer thickness (μm) | 50 | 50 | 50 | 50 | 50 |
| Resistance value variation rate (%) | 214 | 275 | 220 | 291 | 208 |

As seen from Table 3, the effect of suppressing an increase in resistance value was observed for any of the samples in which the thickness of the protective layer was 50 μm.

Experimental Example 4

In Experimental Example 4, a stacked sheet shaped and configured as illustrated in FIGS. 8 and 9 was fabricated. The raw materials for the preparation of the stacked sheet were the same as those described for Experimental Example 1. The longitudinal length of the sensor sheet and the width of the connection portion were also the same as those in Experimental Example 1. However, the rectangular widened portion, which was provided in place of the radial widened portion, had a length of 65 mm in the longitudinal direction of the body portion and a length of 15 mm in the short direction of the body portion, and was provided on both sides of the connection portion. The thickness of the wires was also the same as that in Experimental Example 1. The stacked sheet was further provided with a protective layer formed from a PET film with a thickness of 125 μm, which was the same as that in Experimental Example 1, on the same side of the sensor sheet as the surface on which the wires were provided, on both sides of the wires so as not to overlap the wires. The tail portion was valley-folded to obtain a touch sensor, namely a sample 4F valley.

When variations in resistance value were obtained for the sample 4F valley in the same manner as in the experimental examples described earlier, a rate of 116% was obtained. Thus, the effect of suppressing an increase in resistance value was particularly remarkable for the sample 4F valley. An excellent effect was indicated although a relatively thick protective layer with a thickness of 125 μm was provided.

Figure 15:
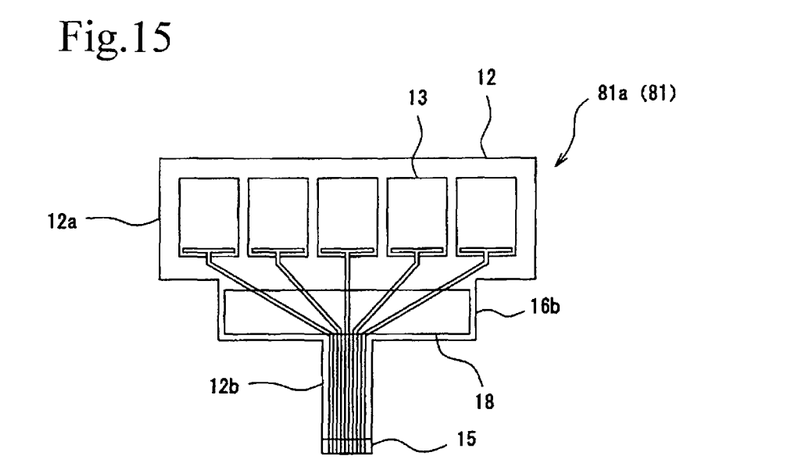
FIG. 15 is a plan view corresponding to FIG. 1, illustrating a touch sensor according to still another modification.
Figure 16:
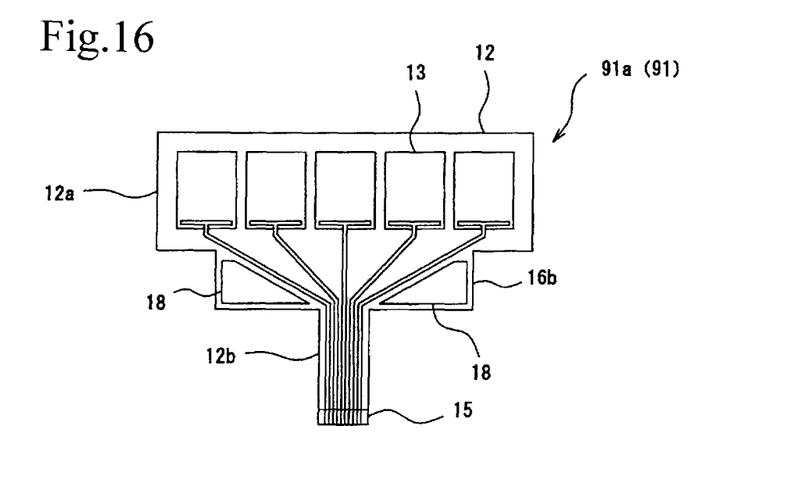
FIG. 16 is a plan view corresponding to FIG. 1, illustrating a touch sensor according to yet another modification.

The embodiment described above is an example of the present invention, and the present invention is not limited thereto. The present invention covers modifications to the shape, material manufacturing method, and so forth of the members without departing from the scope and spirit of the present invention. For example, as in a touch sensor 81*a* before the formation of a folded portion illustrated in FIG. 15, a rectangular widened portion 16*b* may be formed, wires 14 may be provided on the widened portion 16*b* so as to extend radially, and a protective layer 18 may be provided in the same shape as that of the widened portion 16*b* including portions to cover the wires 14. Alternatively, as in a touch sensor 91*a* before the formation of a folded portion illustrated in FIG. 16, a widened portion 16*b* similar to that in the touch sensor 81*a* may be provided, and a protective layer 18 may be provided so as to avoid the wires 14.

REFERENCE SIGNS LIST

10 TOUCH SENSOR (BEFORE FORMATION OF FOLDED PORTION)
11 TOUCH SENSOR
11*a* TOUCH SENSOR (FIRST EMBODIMENT, AFTER FORMATION OF FOLDED PORTION)
11*b* TOUCH SENSOR (MODIFIED EXAMPLE 1)
11*c* TOUCH SENSOR (MODIFIED EXAMPLE 2)
11*d* TOUCH SENSOR (MODIFIED EXAMPLE 3)
12 SENSOR SHEET
12*a* BODY PORTION
12*b* TAIL PORTION
12*c* ELECTRODE FORMATION PORTION
12*d* EDGE PORTION
12*e* INSIDE SURFACE
12*f* OUTSIDE SURFACE
13 SENSOR ELECTRODE
13*a* SENSOR ELECTRODE ON ONE SURFACE
13*b* SENSOR ELECTRODE ON OTHER SURFACE
14 WIRE
14*a* WIRE ON ONE SURFACE
14*b* WIRE ON OTHER SURFACE
15 CONNECTION PORTION
15*a* CARBON PRINT LAYER
15*b* CONNECTION PORTION ON ONE SURFACE
15*c* CONNECTION PORTION ON OTHER SURFACE
16 WIDENED PORTION
16*a* RADIAL WIDENED PORTION
16*b* RECTANGULAR WIDENED PORTION
17 BAND-SHAPED PORTION
18 PROTECTIVE LAYER
18*a* PROTECTIVE LAYER ON ONE SURFACE
18*b* PROTECTIVE LAYER ON OTHER SURFACE
19 RESIST LAYER
19*a* RESIST LAYER ON ONE SURFACE
19*b* RESIST LAYER ON OTHER SURFACE
20 FOLDED PORTION
20*a* FOLDING LINE
21 TOUCH SENSOR (SECOND EMBODIMENT)
21*a* TOUCH SENSOR (BEFORE FORMATION OF FOLDED PORTION)
31 TOUCH SENSOR (THIRD EMBODIMENT)
31*a* TOUCH SENSOR (BEFORE FORMATION OF FOLDED PORTION)
41 TOUCH SENSOR (FOURTH EMBODIMENT)
41*a* TOUCH SENSOR (BEFORE FORMATION OF FOLDED PORTION)
51 TOUCH SENSOR (FIFTH EMBODIMENT)
51*a* TOUCH SENSOR (BEFORE FORMATION OF FOLDED PORTION)
61 TOUCH SENSOR (MODIFIED EXAMPLE 1 OF FIFTH EMBODIMENT)
61*a* TOUCH SENSOR (BEFORE FORMATION OF FOLDED PORTION)
71 TOUCH SENSOR (MODIFIED EXAMPLE 2 OF FIFTH EMBODIMENT)
71*a* TOUCH SENSOR (BEFORE FORMATION OF FOLDED PORTION)
81 TOUCH SENSOR (MODIFIED EXAMPLE)
81*a* TOUCH SENSOR (BEFORE FORMATION OF FOLDED PORTION)
91 TOUCH SENSOR (MODIFIED EXAMPLE)
91*a* TOUCH SENSOR (BEFORE FORMATION OF FOLDED PORTION)
B HOUSING OF ELECTRIC DEVICE
P OPERATION SURFACE OF DISPLAY PANEL
C FOLDING CENTER
R1 WIRE RADIUS
R2 WIRE RADIUS
θ WIDENING ANGLE

The invention claimed is:

1. A touch sensor comprising;
a sensor sheet that has a plurality of sensor electrodes,
wires that extend from the sensor electrodes to the tail portion,
a resist layer formed on the sensor sheet configured to protect the sensor electrodes and the wires, and
wherein the sensor sheet has
   a body portion in which the sensor electrodes are formed,
   a tail portion
     in which the wires are formed,
     in which the sensor electrodes do not exist,
     which is located directly under the body portion in a folded state, and
     which has a connection portion at an end of the tail portion,
   a widened portion which is extended and widened from the tail portion towards the body portion, and which has a folding line to fold the body portion with the sensor electrodes over the tail portion,
   an air space between the body portion and the tail portion in the folded state, and
   a protective layer formed only on the widened portion in which the sensor sheet is bent permanently along the folding line.

2. The touch sensor according to claim 1, wherein the protective layer is provided at a position at which the protective layer does not overlap the wires, wherein the widened portion is provided transversely configured not to pass the wires.

3. The touch sensor according to claim 1, wherein the protective layer is provided at a position at which the protective layer overlaps the wires.

4. The touch sensor according to claim 1, wherein-the widened portion is formed at the tail portion, wider than the connection portion and narrower than the electrode formation portion, widened radially from the connection portion toward the electrode formation portion.

5. The touch sensor according to claim 1, wherein the protective layer is constituted of a resin film.

6. The touch sensor according to claim 1, wherein the protective layer has a thickness of 50 μm to 75 μm.

7. The touch sensor according to claim 1, wherein at least the sensor electrodes, the connection portion, and the wires are provided on each of one surface and the other surface of the sensor sheet.

8. An electronic device comprising a housing and the touch sensor according to claim 1 provided inside the housing.

9. The touch sensor according to claim 1, wherein the protective layer is provided externally on the folded portion.

10. The touch sensor according to claim 1, wherein the protective layer is provided internally on the folded portion.

11. The touch sensor according to claim 1, wherein the widened portion has a different width from either of the tail portion and the body portion.

12. The touch sensor according to claim 1, wherein the widened portion is narrower than the body portion and wider than the tail portion.

13. The touch sensor according to claim 1, wherein the space is formed for an amount corresponding to a thickness of the protective layer on an inner side of the wires.

* * * * *